United States Patent [19]

Stawiski

[11] 4,083,222
[45] Apr. 11, 1978

[54] APPARATUS FOR MEASURING THE RATE OF A WATCH

[75] Inventor: Wladyslaw Stawiski, Meyrin, Switzerland

[73] Assignee: Portescap, La Chaux-de-Fonds, Switzerland

[21] Appl. No.: 763,677

[22] Filed: Jan. 28, 1977

[30] Foreign Application Priority Data

Feb. 2, 1976 Switzerland .................. 1282/76

[51] Int. Cl.² .................. G04D 7/12; G04F 5/10
[52] U.S. Cl. .................................................. 73/6
[58] Field of Search ............... 73/6; 324/78 F, 78 D, 324/78 R, 78 Z, 186

[56] References Cited

U.S. PATENT DOCUMENTS 3,756,066  9/1973  Bolliger .................................. 73/6
3,811,314  5/1974  Anouchi .................................. 73/6

Primary Examiner—James J. Gill
Attorney, Agent, or Firm—Cushman, Darby & Cushman

[57] ABSTRACT

An apparatus for measuring the rate of a watch is disclosed including a sensing device for the signals produced by a watch to be checked, a selecting and pulse shaping circuit, and comparator means for comparing the repetition frequency of the measuring pulses with the frequency of standard pulses. The selecting and pulse shaping circuit is designed to constitute a monostable multivibrator the period of which is automatically adapted to the period of the signal to be measured. The selecting circuit is unsensitive to secondary and disturbing noise signals during a very high percentage of the time interval corresponding to the period to be measured and allows the checking of watches having frequencies between about 1 Hz and 32 kHz.

5 Claims, 4 Drawing Figures

APPARATUS FOR MEASURING THE RATE OF A WATCH

The present invention relates to an apparatus for measuring the rate of a watch, of the kind including a sensing device for the signals produced by a watch to be checked, a selecting and pulse shaping circuit coupled to the sensing device for providing measuring pulses, and comparator means for comparing the repetition frequency of the measuring pulses or pulses derived therefrom with the constant repetition frequency of standard pulses produced by a standard oscillator.

A problem arising in apparatus for measuring the rate of a watch is the elimination, prior to the actual measure, of disturbing signals which can be produced by secondary or additional noise sensed by the sensing device. Those disturbed signals do not occur with the frequency to be measured and can therefore lead to important measuring faults.

In known apparatus of this kind a selecting circuit is provided which is designed for a given frequency range or needs to be adjusted by hand to the frequency range corresponding approximately to the rate of the watch to be measured. Such a known selecting circuit in fact uses a fixed blocking time in the signal processing circuit, which means that all signals occuring within the blocking time interval are not taken into consideration. However, the adjustment of such a selecting circuit is a major drawback and it complicates and limits the use of the apparatus. It also reduces the attainable efficiency of noise elimination due to the necessary margin to be left between the blocking time and the expected period to be measured.

It is a main object of the invention to provide an apparatus for measuring the rate of a watch, wherein the signal selecting circuit automatically adjusts itself to the frequency to be measured, thus avoiding a manual adjustment for different nominal frequencies. More particularly, it is an object to cover a wide range of frequencies including those of mechanical watches from 1 Hz and electronic watches up to 32 kHz approximately.

It is a further object of the invention to provide an apparatus of the above mentioned kind, wherein the signal selecting circuit is of a simple and reliable design and achieves a very high degree of noise elimination.

Further objects and advantages of the invention will become apparent from the description of an embodiment of the invention given by way of example and being illustrated in the accompanying drawings in which.

Figure 1:
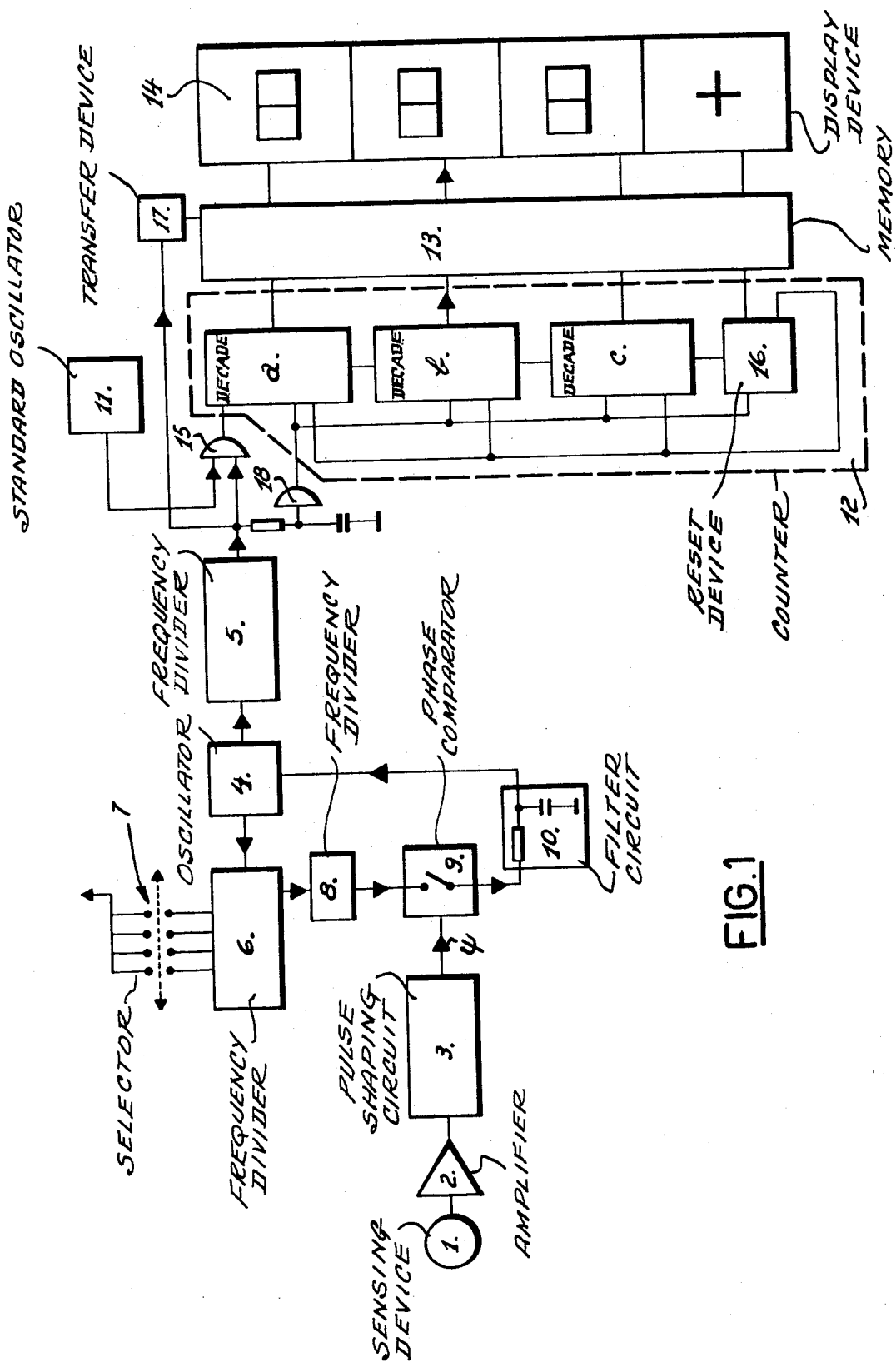
FIG. 1 shows a diagram of an apparatus for measuring the rate of a watch in accordance with the invention.

Referring to the diagram of FIG. 1, the apparatus comprises a sensing device 1 of a known type for sensing the signals produced by a watch movement to be checked. The output signals of the sensing device are fed through an amplifier 2 to a selecting and pulse shaping circuit 3 which will be described in detail in connection with FIG. 2. The output of circuit 3 is a series of measuring pulses $\psi$ the period of which is a measure for the actual rate of the watch. As shown in FIG. 1, according to a preferred embodiment the pulses $\psi$ are further processed in a closed loop arrangement 4, 6, 7, 8, 9, 10 comprising a local oscillator 4, an adjustable frequency divider 6 and selector means 7, a frequency devider 8 of constant rate of division, a phase comparator 9 and a filter circuit 10. This arrangement is similar to that described in Swiss Pat. No. 573 625 and provides a measuring signal at the output of oscillator 4 having a frequency proportional to the repetition frequency of the measuring pulses.

The frequency of the measuring signal can be determined in a usual way be counting the oscillations of a standard frequency oscillator during a time interval relates to the measuring frequency. In the diagram of FIG. 1, the measuring signal is divided in a constant rate divider 5 and than applied to a first input terminal of a logic gate 15 which receives on a second input terminal a standard frequency signal produced by a standard oscillator 11.

A counting device 12 including three counting decades a, b, c is connected to the output of gate 15 and a memory device 13 is coupled between the output of the said decades and a display device 14. Reset and transfer circuits are schematically indicated in FIG. 1 by units 18, 16 and 17 respectively. However, any known measuring device adapted to measure the frequency of the output signal of oscillator 4 can be used in this connection.

Figure 2:
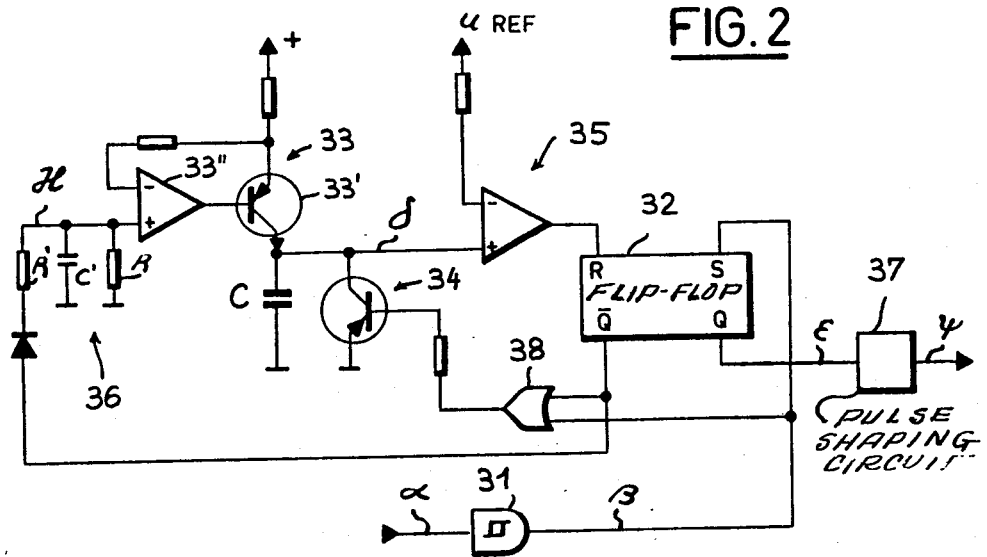
FIG. 2 shows a diagram of a selecting and pulse shaping circuit being part of the apparatus of FIG. 1.

FIG. 2 shows a more detailed diagram of the selecting and pulse shaping circuit 3 which is used in the apparatus according to the invention.

The preamplified watch signals appearing at the output of amplifier 2 are denoted $\alpha$. They are first fed to an input pulse shaping circuit 31 which can comprise a Schmitt-trigger circuit to provide at the output thereof pulses $\beta$ of constant height and of a duration determined by the time during which signals $\alpha$ exceed a predetermined level. A flip-flop circuit 32 has a first input S connected to the output of 31. A first output $\Omega$ of circuit 32 providing an output signal $\epsilon$ is connected, according to a preferred embodiment, to an output pulse shaping circuit 37 constituted by a monostable multivibrator. At the output of circuit 37 appear measuring pulses $\psi$ of a predetermined duration and of the frequency to be measured.

A second output $\overline{Q}$ of flip-flop 32 is connected through a coupling diode and an integrating network 36 to one input of a differential amplifier 33". The integrating network 36 is represented by a resistor R' and capacitor C', a capacitor discharging resistor R >> R' being provided in parallel with C'. The output of amplifier 33" is connected to the gate or control electrode of a transistor 33', the emittor-collector or conduction path of which is connected in series with the capacitor C and a voltage source. The emittor of transistor 33' is coupled through a resistor to a second input of the said differential amplifier 33". The arrangement of 33' and 33" constitutes a current generator designated as a whole by 33', which generator is controlled by the voltage $\pi$ provided through the integrating network 36.

The voltage $\delta$ across capacitor C is applied to a first input of a detection circuit 35 constituted by a differential amplifier 35, the second input of which is connected to a source of constant voltage $u_{REF}$. The output of the detection circuit is connected to a second input terminal R of flip-flop 32. A discharging circuit 34 for the capacitor C is formed by a transistor the conduction path of which is connected in parallel with C and the gate of which is coupled through a logic OR-gate 38 with the output $\bar{Q}$ of flip-flop 32 and with the output of circuit 31.

Figure 3A:
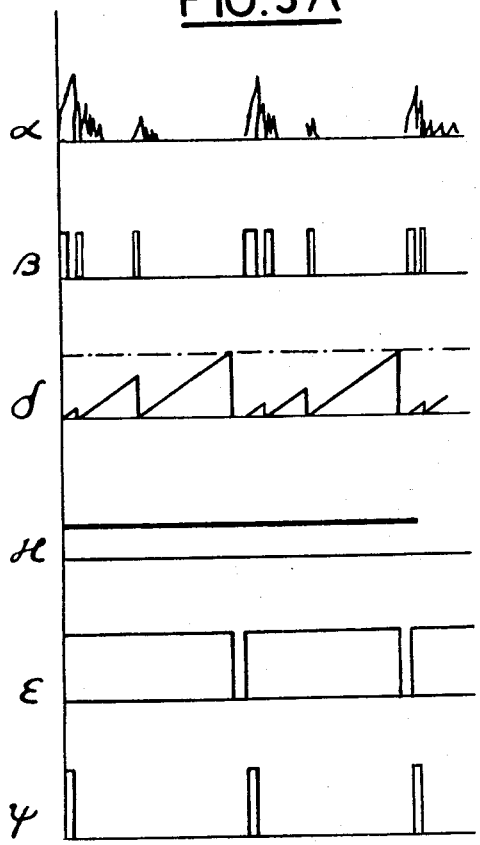
FIGS. 3A and 3B show the signals appearing at various points of the circuit of FIG. 2 in the case of two different watch rates being measured.
Figure 3B:
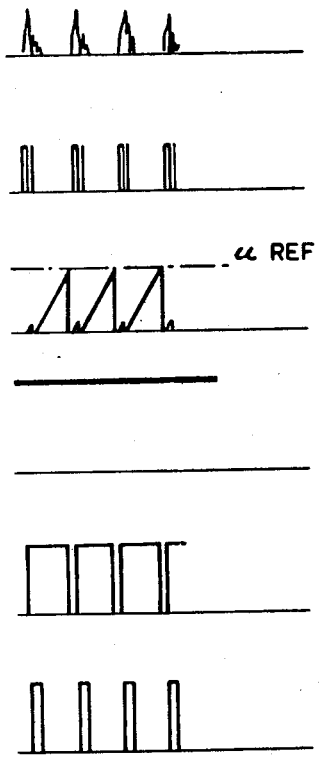

The operation of the circuit of FIG. 2 will now be explained with reference to FIGS. 3A and 3B illustrating respectively the case of a watch having a relatively low frequency and a watch having a higher frequency. Watch signals $\alpha$ have for instance the shape illustrated in line $\alpha$ of FIGS. 3A and 3B corresponding approximately to the shape of the acoustic signals emitted by a mechanical watch movement. While those signals present a periodicity corresponding to the frequency of the watch movement, secondary noises and disturbing signals from outside of the watch are generally also sensed or produced in the sensing device 1. Line $\beta$ shows the pulses $\beta$ obtained as described above by the shaping circuit 31. It can be seen that these pulses still contain unwanted pulses due to signals exceeding the input level. The leading edge of each pulse $\beta$ is applied through OR-gate 31 to the gate of transistor 34 for discharging capacitor C with a very short time constant. Voltage $\delta$ is therefore instantaneously brought to zero and immediately thereafter, transistor 34 being again in a non-conductive state allows the capacitor C to be charged by the current supplied through current generator 33. Voltage $\delta$ increases substantially linearly until a following pulse again discharges capacitor C. If the time interval between successive pulses $\beta$ is relatively short, the voltage across capacitor C will not reach a given reference level defined by the constant reference voltage $u_{REF}$ of detection circuit 35. If the said time interval is of sufficient length, the voltage will exceed $u_{REF}$ and a signal pulse will be delivered by circuit 35 to input R of flip-flop 32 bringing the output Q to the zero state, as shown in line $\epsilon$ of FIGS. 3A and 3B.

In the circuit shown in FIG. 2, the signal appearing at the output $\bar{Q}$ when $\delta$ reaches $u_{REF}$ will discharge capacitor C before the occurrence of the next pulse $\beta$. This is an optional feature which is not necessary for the basic operation of the circuit. In other words, the circuit also operates without a connection from $\bar{Q}$ to the discharging circuit 34, in which case the output of 31 would be directly connected to 34 without logic gate 38. However, it is an advantage, in particular at high frequencies at which the discharge time cannot be neglected, to discharge capacitor C at the level $u_{REF}$ and to have the same maintained in a discharged condition until the charging again begins after occurrence of the leading edge of a following pulse $\beta$.

Provided that the current generator 33 charges the capacitor with a suitable time constant, as well be explained below, the circuit of FIG. 2 delivers at Q an output signal $\epsilon$ in which the leading edge of the 1-state is synchronized with the leading edge of a first pulse $\beta$ occurring after a relatively long time interval, while the other pulses $\beta$ occurring at shorter time intervals do not have any effect on $\epsilon$. The successive leading edges of the pulses $\epsilon$ therefore reflect the periodicity of the watch signals and the thus obtained measuring signal is practically free of additional noise or disturbing secondary signals which do not present the said periodicity.

The noise elimination efficiency of the circuit will be the better the shorter the time interval between a trailing edge and the following leading edge of the 1-state of $\epsilon$ can be made. In the circuit of the invention the signal appearing at $\bar{Q}$, which is complementary of $\epsilon$ and therefore in the 1-state during the mentioned interval, is integrated in circuit 36. This means that the control voltage $\pi$ at the output of the integrator is proportional to the length and to the repetion frequency of the said 1-state at $\bar{Q}$. The current generator 33 being controlled by the value of the voltage $\pi$ and providing an increased charging current with increasing $\pi$, the time constant for the charging of capacitor C is automatically varied and in particular adapted to the frequency of the measuring pulses. The different levels of the control voltage $\pi$ in FIGS. 3A and 3B and the corresponding slopes of the sawtooth signals $\delta$ illustrate this feature. The described control loop in fact gives the circuit the behaviour of a monostable multivibrator the period of which is automatically adapted to the frequency of the input signal. The reaction of the control loop takes place with some inertia due to the presence of the integrating network 36.

The automatic control of the blocking time which is obtained in the present signal selecting circuit allows the same to be used over a wide range of measuring frequencies without adjustment from outside. In a practical embodiment this range extended from 1 Hz to 32 kHz.

In the described selecting circuit the filling factor of the multivibrator, that means in this case the proportion of the duration of the 1-state of $\epsilon$ with respect to the total period thereof can attain values of 95%. As mentioned above, this leads to a correspondingly high capability of noise elimination, as only noise signals occurring during the unfilled time interval can act on the circuit.

The last line of FIGS. 3A and 3B shows the pulses $\psi$ which are obtained at the output of the monostable multivibrator 37 provided in the embodiment of FIG. 2. This multivibrator is triggered by the leading edge of the 1-state pulses $\epsilon$ and delivers pulses $\psi$ of constant height and duration which can easily be further processed in the successive circuits of the apparatus of FIG. 1 or in similar circuits for measuring the frequency of these pulses.

What is claimed is:

1. An apparatus for measuring the rate of a watch, including a sensing device (1) for the signals produced by a watch to be checked, a selecting and pulse shaping circuit (3) coupled (through (2) to the sensing device for providing measuring pulses ($\epsilon$ or $\psi$), and including comparator means (12,13,14,15) for comparing the repetition frequency of the measuring pulses or of pulses derived therefrom with the constant repetition frequency of standard pulses produced by a standard oscillator (11) for determining the rate of the watch to be checked, wherein the selecting and pulse shaping circuit (3) comprises an input pulse shaping circuit (31) coupled to the sensing device and adapted to provide output pulses ($\beta$) having each a given constant height and a duration determined by the time interval during which the corresponding watch signal ($\alpha$) exceeds a given threshold level, a flip-flop circuit (32) a first input (S) of which is connected to the output of the pulse shaping circuit (31) and a first output (Q) of which delivers the said measuring pulses ($\epsilon$), a capacitor (C), a current generator (33) connected for charging the said capacitor (C) by a variable current depending on a control voltage ($\pi$) applied to the said current generator, a discharging circuit (34) connected to the said capacitor (C) and having a control input coupled at least to the output of the said pulse shaping circuit (31), the time constant of the said discharging circuit being small as compared to the time constant of charging the capacitor, a detection circuit (35) connected for detecting the voltage (δ) across the said capacitor (C) and for providing an input signal to a second input (R) of the said flip-flop circuit (32) each time the detected voltage (δ) exceeds exceeds a predetermined reference level, and an integrator circuit (36), the input of which is coupled to a second output (Q) of the said flip-flop circuit (32) and the output of which is coupled to the said current generator (33) for providing the said control voltage (π).

2. An apparatus in accordance with claim 1, further comprising a logic OR-gate (38), a first input of which is connected to the output of the said pulse shaping circuit (31), a second input of which is connected to the said output (Q̄) of the flip-flop circuit (32), and the output of which is connected to the said control input of the discharging circuit (34).

3. An apparatus in accordance with claim 1, wherein the said current generator (33) comprises a solid state device (33') having a conduction path of variable resistance connected in series with the said capacitor (C) and a voltage source, and having a control electrode connected to the output of a differential amplifier (33''), the voltage across the said capacitor (C) and solid state device (33') being applied to one input and the output voltage of the said integrator circuit (36) being applied to the other input of the said differential amplifier (33'').

4. An apparatus in accordance with claim 1, wherein the detection circuit (35) comprises a differential amplifier a first input of which is connected to a source of constant reference voltage, a second input of which receives the voltage appearing across the said capacitor (C) and the output of which is connected to the said second input (R) of the flip-flop circuit (32)

5. An apparatus in accordance with claim 1 wherein the said current generator (33) comprises a solid state device (33') having a conduction path of variable resistance connected in series with the said capacitor (C) and a voltage source, and having a control electrode connected to the output of a differential amplifier (33''), the voltage across the said capacitor (C) and solid state device (33') being applied to one input and the output voltage of the said integrated circuit (36) being applied to the other input of the said differential amplifier (33''), and wherein the detection circuit (35) comprises a differential amplifier a first input of which is connected to a source of constant reference voltage, a second input of which receives the voltage appearing across the said capacitor (C) and the output of which is connected to the said second input (R) of the flip-flop circuit (32).

* * * * *